United States Patent [19]
Oyama

[11] Patent Number: 5,479,611
[45] Date of Patent: Dec. 26, 1995

[54] DISK ARRAY APPARATUS

[75] Inventor: Hiroshi Oyama, Tokyo, Japan

[73] Assignee: NEC Corporation, Tokyo, Japan

[21] Appl. No.: 334,387

[22] Filed: Nov. 3, 1994

[30] Foreign Application Priority Data

Nov. 10, 1993 [JP] Japan .................. 5-280793

[51] Int. Cl.$^6$ ................... G06F 11/34; G06F 11/10; H03M 13/02
[52] U.S. Cl. ............... 395/185.01; 395/182.04; 371/49.1
[58] Field of Search ............... 395/575, 185.01, 395/182.04; 371/10.1, 2.6, 8.1, 13, 49.1, 49.2, 51.1, 2.2

[56] References Cited

U.S. PATENT DOCUMENTS

| | | | |
|---|---|---|---|
| 5,210,860 | 5/1993 | Pfeffer et al. | 395/575 |
| 5,220,569 | 6/1993 | Hartness | 371/37.7 |
| 5,233,618 | 8/1993 | Glider et al. | 371/68.1 |
| 5,333,305 | 7/1994 | Neufeld | 395/575 |
| 5,341,381 | 8/1994 | Fuller | 371/10.1 |
| 5,373,512 | 12/1994 | Brady | 371/40.1 |
| 5,392,244 | 2/1995 | Jacobson et al. | 365/200 |
| 5,396,620 | 3/1995 | Burghart et al. | 395/575 |
| 5,402,428 | 3/1995 | Kakuta et al. | 371/10.1 |

FOREIGN PATENT DOCUMENTS 62-285162  12/1987  Japan .

OTHER PUBLICATIONS

Patterson, et al.; "A Case for Redundant Arrays of Inexpensive Disks (RAID)"; Report No. UCD/CSD 87/391, Dec. 1987, Computer Science Division (EECS), University of California, Berkeley.

Primary Examiner—Robert W. Beausoliel, Jr.
Assistant Examiner—Albert Décady
Attorney, Agent, or Firm—Whitham, Curtis, Whitham & McGinn

[57] ABSTRACT

In a disk array apparatus, a microprocessor includes a repairing section for causing, upon receiving the report of the content of occurrence of an error from a physical device interface controller unit, an array data controller unit to repair read data by using received data from physical devices except for the one which has reported an unrecoverable read error. The microprocessor also includes a transfer section for transferring the repaired data obtained by the repairing section to a host apparatus as read data, a writing section for writing the repaired data in a data buffer unit, a write end determining section for determining the end of the write of the repaired data from the count value of a data block counter unit, a reallocating section for reallocating a replacement sector to the physical device which has reported the error, and a readout section for reading out the repaired data written in the data buffer unit and storing the readout data in the replacement sector allocated by the reallocating section, after the write end determining section determines the end of the write.

7 Claims, 7 Drawing Sheets

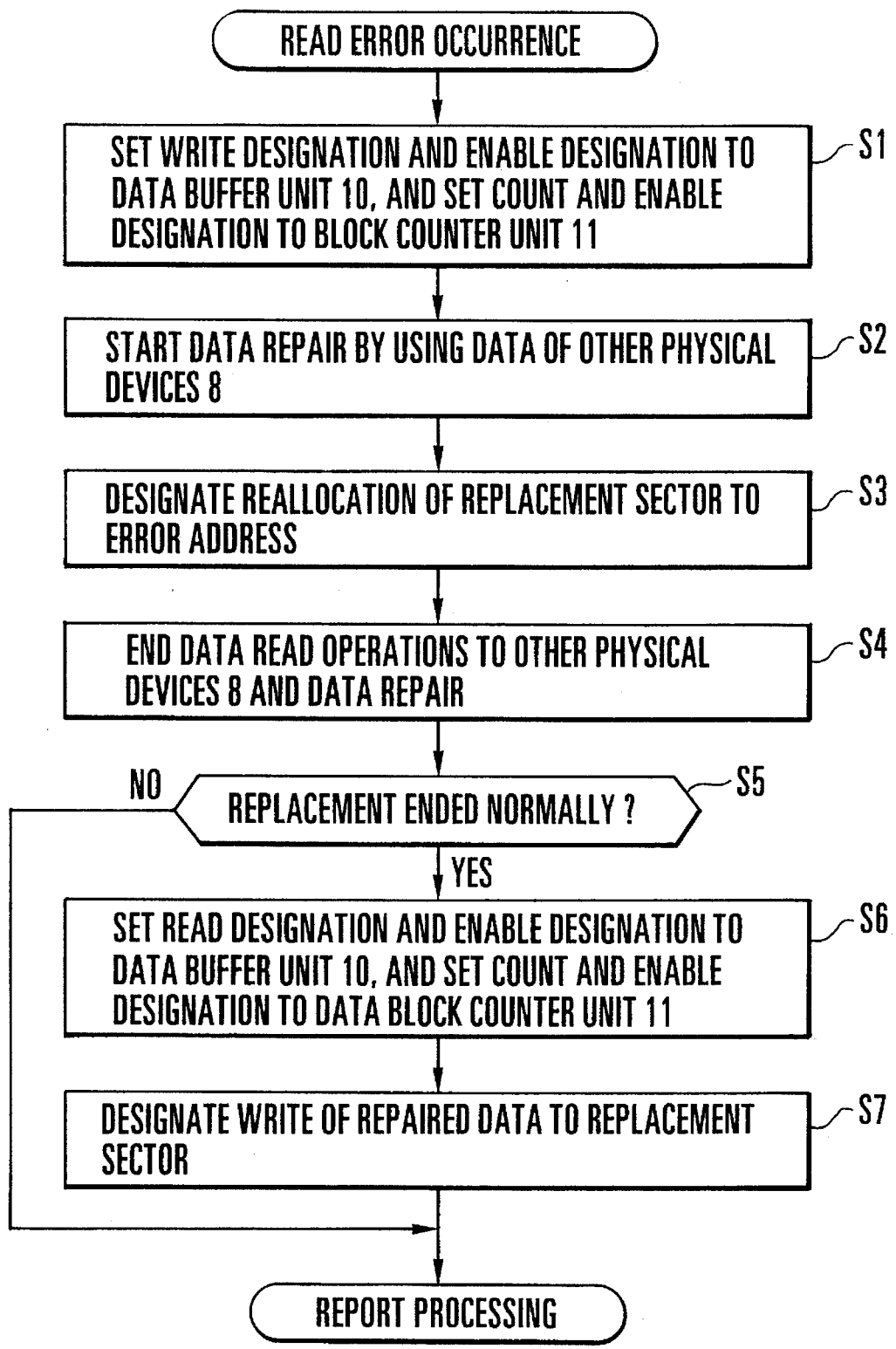
F I G. 5

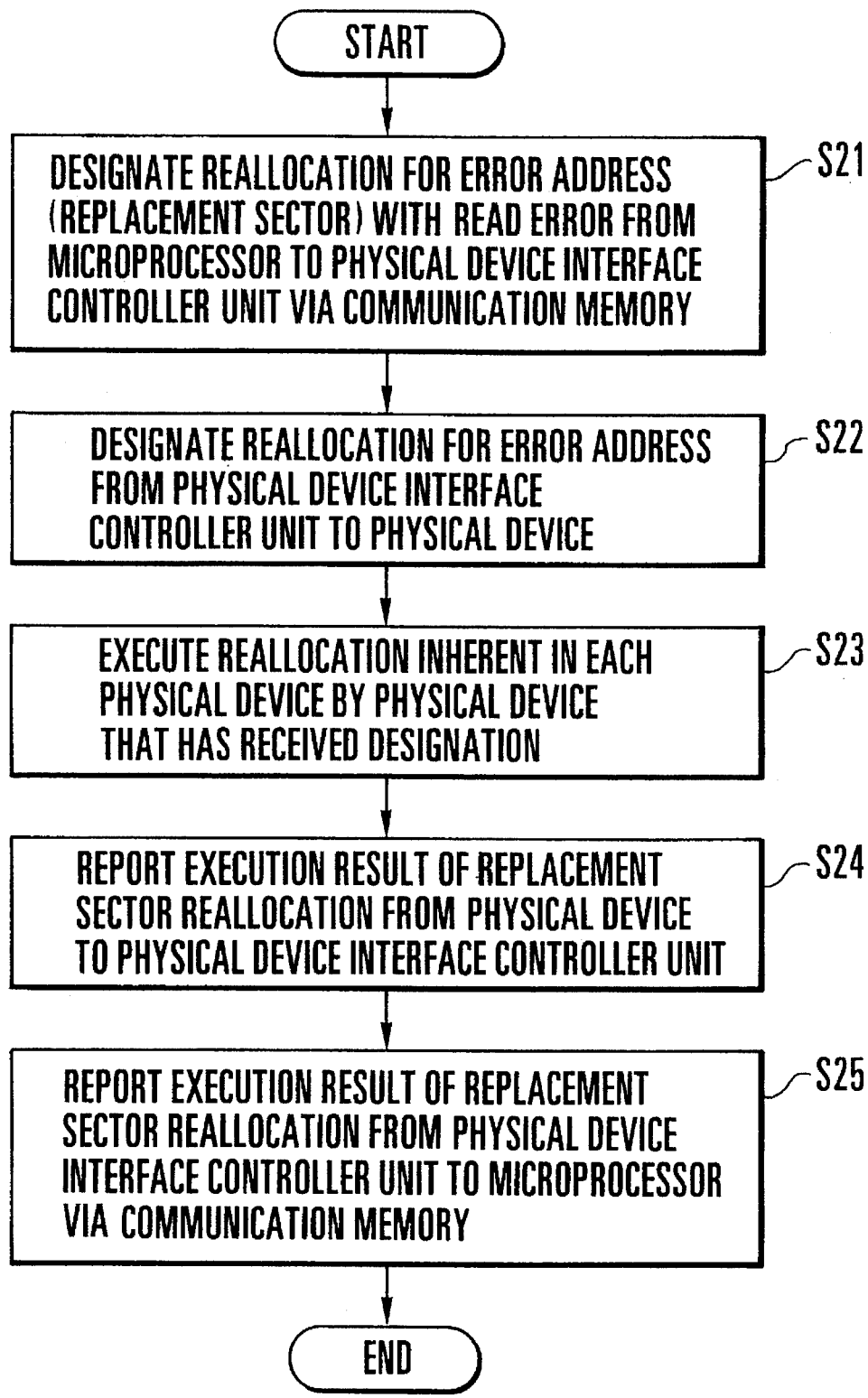
F I G. 8

DISK ARRAY APPARATUS

BACKGROUND OF THE INVENTION

The present invention relates to a disk array apparatus which realizes a single high-reliability, high-performance magnetic disk unit (to be referred to as a logic device hereinafter) by causing a plurality of small, inexpensive magnetic disk units (each individual magnetic disk unit will be referred to as a physical device hereinafter) to perform synchronous parallel processing.

As is well known, "A Case for Redundant Arrays of Inexpensive Disks (RAID)," Technical Report UCB/CSD 87/391, Dec. 1987 has reported RAID1 to RAID5 as forms of a disk array apparatus.

In one of the disk array apparatus control schemes proposed in this technical report, in which a disk array apparatus uses a data parity, if an unrecoverable read error occurs in one physical device, the data of a physical sector in which the read error has occurred is repaired by using the data of other physical devices. The repaired data is then transferred to a host apparatus. Upon receiving from the host apparatus (host computer) a designation of reallocation of a replacement sector to the physical sector in which the unrecoverable read error has taken place, the disk array apparatus separates the physical sector with the read error and writes the repaired data in the replacement sector reallocated by the host apparatus.

As described above, if an unrecoverable read error takes place in one physical device of a conventional disk array apparatus, the data of a physical sector in which the read error has occurred is repaired using the data of other physical devices, and the repaired data is transferred to a host apparatus.

In this control scheme, however, if a physical sector of a physical device in which a read error has occurred is left unrepaired by a host apparatus, a decisive data fault is caused by occurrence of a fault at the same address in another physical device. Additionally, the load on the host apparatus is increased if the host apparatus is to perform separation of an error sector and rewrite of data. Therefore, if an unrecoverable read error takes place in a physical device, it is necessary to apply an extra load on the host apparatus to maintain high reliability.

As another prior art, Japanese Patent Laid-Open No. 62-285162 (to be referred to as "prior art" hereinafter) discloses a "memory device" in which a substitute memory area is added to a shared memory device. A CPU of this memory device can separate a fault area and replace it with the substitute memory area by changing the conditions of an address decoder, thereby improving the reliability of the device.

As discussed above, if an unrecoverable read error occurs in a physical device of a conventional disk array apparatus, it is required to apply an additional load on a host apparatus to keep high reliability.

SUMMARY OF THE INVENTION

The present invention has been made to solve the above problem and has its object to provide a disk array apparatus capable of repairing the data of a physical device in which an unrecoverable read error has occurred during data read and transferring the repaired data to a host computer, and also capable of rewriting the repaired data in a replacement sector for the error address, thereby realizing high reliability and high performance.

The prior art described above is the invention of a memory device in which a memory area where an unrecoverable fault has taken place is replaced with a substitute memory area of the same system in accordance with a designation from a host apparatus. Unlike the present invention, therefore, the above prior art has not at all disclosed a technical thought of transferring repaired data to a host apparatus and at the same time rewriting the repaired data when a read error has occurred.

To achieve the above object, the present invention provides a disk array apparatus comprising a host interface connected to a host apparatus, a host interface controller unit, connected to the host interface, for controlling data input/output of the host interface by using a microprocessor, a first array data bus connected to the host interface controller unit, a disk array data controller unit, connected to the first array data bus, for performing input data edit processing in accordance with a designation from the microprocessor, a plurality of physical devices for storing data, at least one of the physical devices being used to store parity data, and each of the physical devices having a function of reporting occurrence of an error if an unrecoverable read error occurs, a plurality of physical device interfaces connected to the physical devices, a plurality of physical device interface controller units for controlling data transmission/reception with respect to the physical devices via the physical device interfaces, each of the physical device interface controller units having a function of reporting a content of occurrence of an error to the microprocessor upon receiving a report of occurrence of an error from the physical device, a plurality of third array data buses for performing data communication between the disk array data controller unit and the physical device interface controller units, a data buffer unit, connected to the first array data bus through the third array data buses, for storing repaired data for an unrecoverable read error occurring in one of the physical devices, and a data block counter unit having a function of counting data in performing data write/read to the data buffer unit, and reporting the end of the data write/read, wherein the microprocessor comprises repairing means for causing, upon receiving the report of the content of occurrence of an error from the physical device interface controller unit, the array data controller unit to repair read data by using received data from the physical devices except for the one which has reported the unrecoverable read error, transfer means for transferring the repaired data obtained by the repairing means to the host apparatus as read data, writing means for writing the repaired data in the data buffer unit, write end determining means for determining the end of the write of the repaired data from the count value of the data block counter unit, reallocating means for reallocating a replacement sector to the physical device which has reported the error, and means for reading out the repaired data written in the data buffer unit and storing the readout data in the replacement sector allocated by the reallocating means, after the write end determining means determines the end of the write.

In the disk array apparatus with the above arrangement, data repair is performed for a physical device in which an unrecoverable read error has occurred during data read by using the data (including the parity data) of other physical devices, and the repaired data is transferred to the host apparatus. In addition, the disk apparatus itself can rewrite the repaired data in a substitute sector for the physical device with the error. This allows the apparatus to have high reliability and high performance.

BRIEF DESCRIPTION OF THE DRAWINGS

FIG. 5 is a flow chart for explaining the outline of an operation from occurrence of an unrecoverable read error in a physical device to report processing to a host apparatus in the embodiment of FIG. 1, including a replacement sector reallocation designation and a repaired data rewrite designation from a microprocessor;

FIG. 8 is a flow chart showing reallocation of a replacement sector to an error address performed in step S3 of FIG. 5 in the embodiment of FIG. 1.

DESCRIPTION OF THE PREFERRED EMBODIMENT

An embodiment of the present invention will be described in detail below with reference to the accompanying drawings.

Figure 1:
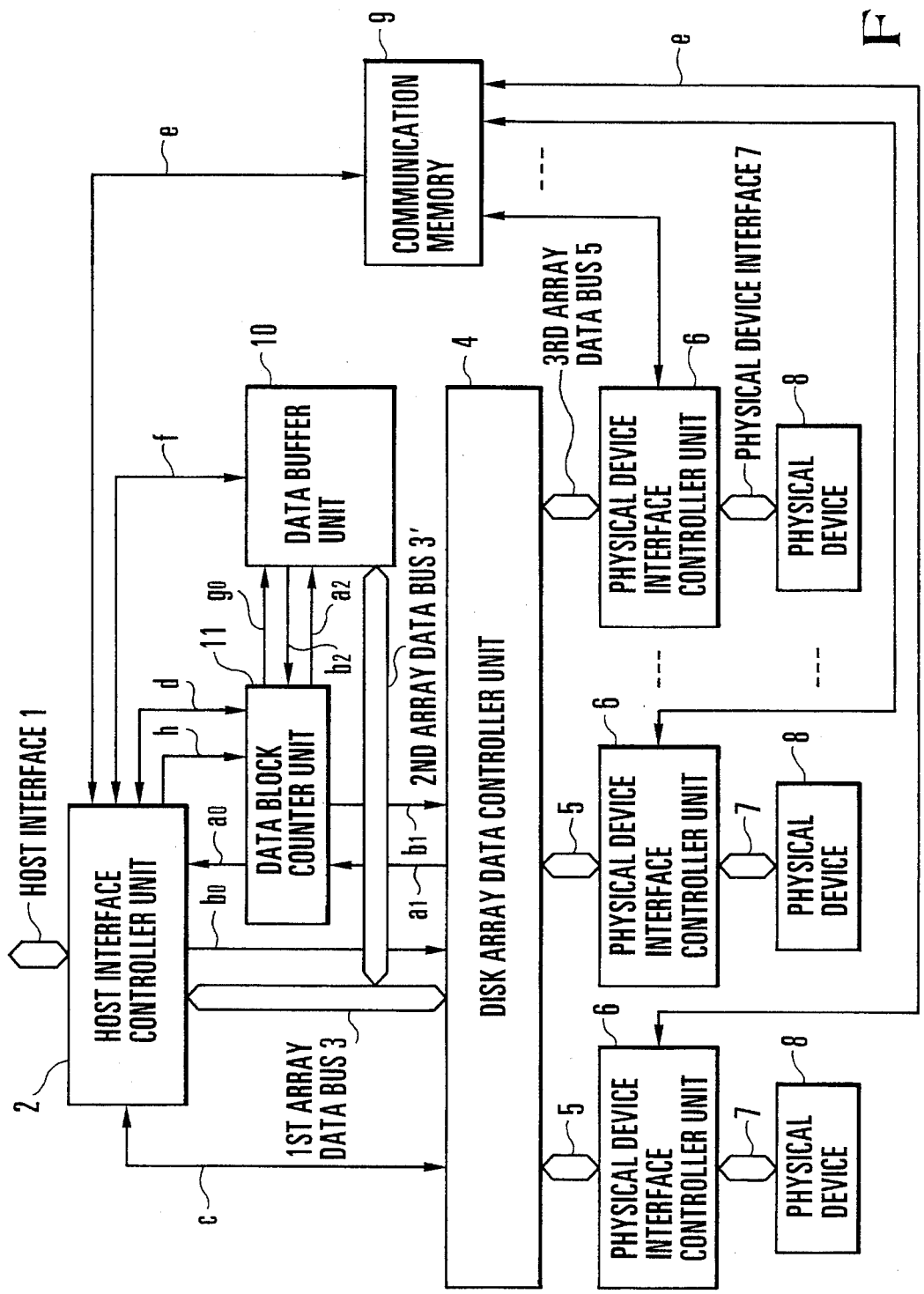
FIG. 1 is a block diagram showing the arrangement of a disk array apparatus according to an embodiment of the present invention.

FIG. 1 shows the arrangement of a disk array apparatus according to the present invention. Reference numeral 1 denotes a host interface for communicating with a host apparatus; and 2, a host interface controller unit for communicating with the host apparatus by controlling data input/output of the host interface 1.

Reference numeral 3 denotes a first array data bus for performing data communication between the host interface controller unit 2 and a disk array data controller unit 4; and 3', a second array data bus for performing data communication between the host interface controller unit 2, the disk array data controller unit 4, and a data buffer unit 10 through the first array data bus 3.

The disk array data controller unit 4 divides received data from the host interface 1 or assembles received data from physical devices 8.

Reference symbols a0 and a1 denote data request signals for communicating data through the first and second data buses 3 and 3'; b0 and b1, data acknowledge signals for communicating data through the first and second array data buses 3 and 3'; and c, a first control/monitor path through which the host interface controller unit 2 controls the operation of the disk array data controller unit 4.

The physical devices 8 are for storing data. Reference numeral 6 denotes a plurality of physical device interface controller units for controlling data transmission and reception with respect to the physical devices 8; 5, a plurality of third array data buses for data communication between the disk array data controller unit 4 and the physical device interface controller units 6; and 7, a plurality of physical device interfaces for data communication between the physical device interface controller units 6 and the physical devices 8.

One of the physical devices 8 is used as a physical device for a data parity.

Reference numeral 9 denotes a communication memory for communication between the host interface controller unit 2 and the physical device interface controller units 6. The data buffer unit 10 stores repaired data. Reference numeral 11 denotes a data block counter unit for counting repaired data when the data is written in or read out from the data buffer unit 10.

Reference symbols a2 and b2 denote a data request signal and a data acknowledge signal, respectively, for allowing the data buffer unit 10 to perform data communication via the data block counter unit 11 through the second array data bus 3'.

Reference symbol d denotes a second control/monitor path through which the host interface controller unit 2 controls the operation of the data block counter unit 11; e, communication paths for connecting the communication memory 9 to the host interface controller unit 2 and to the physical device interface controller units 6; and f, a third control/monitor path through which the host interface controller unit 2 controls the operation of the data buffer unit 10.

Reference symbol g0 denotes an operation end designation signal for informing the data buffer unit 10 of the end of counting by the data block counter unit 11; and h, a data block counter unit control signal for switching the active and inactive states of the data block counter unit 11 in accordance with a designation from a microprocessor 13 (to be described below).

Figure 2:
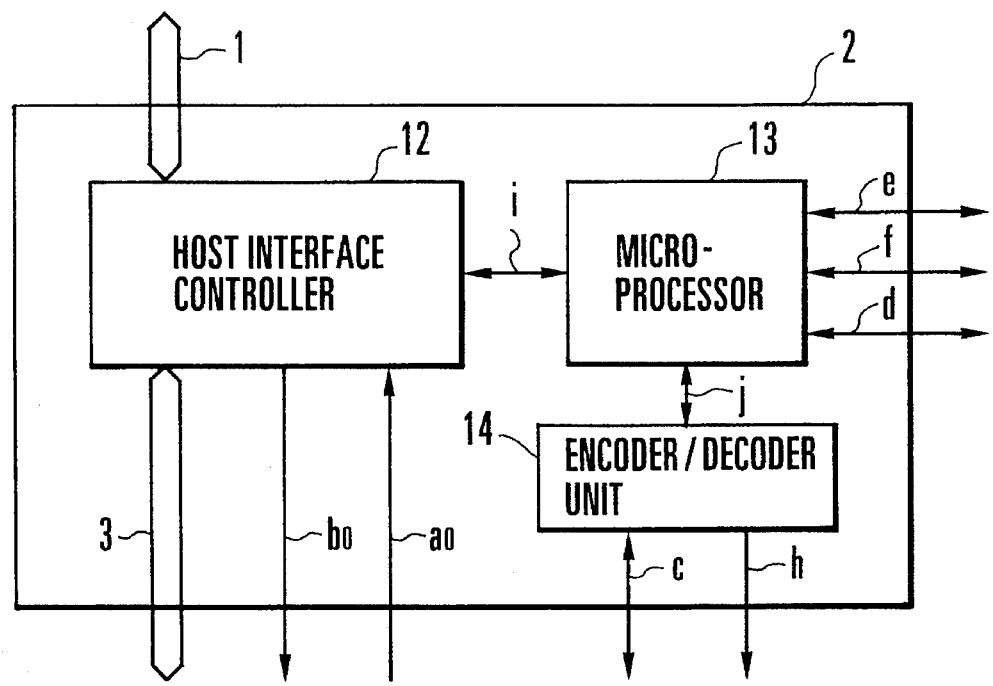
FIG. 2 is a block diagram showing the internal arrangement of a host interface controller unit of the embodiment in FIG. 1.

FIG. 2 shows the internal arrangement of the host interface controller unit 2. Reference numeral 12 denotes a host interface controller for controlling the host interface 1. The microprocessor 13 controls the host interface controller unit 2. Reference numeral 14 denotes a control instruction encoder/decoder unit for encoding/decoding control instructions from the microprocessor 13.

Reference symbol i denotes a host interface control path through which the microprocessor 13 controls the host interface controller 12; and j, a control instruction path through which the microprocessor 13 issues control instructions to the control instruction encoder/decoder unit 14.

Figure 3:
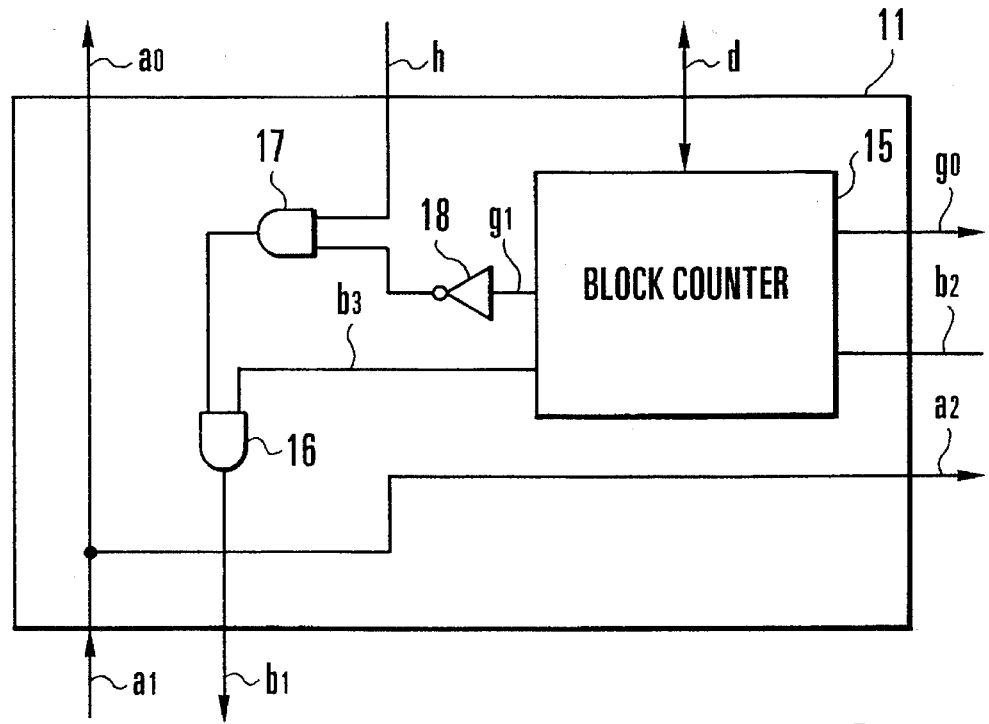
FIG. 3 is a block diagram showing the internal arrangement of a data block counter unit of the embodiment in FIG. 1.

FIG. 3 shows the internal arrangement of the data block counter unit 11. Reference numeral 15 denotes a block counter for counting repaired data when a write or read of the data to the data buffer unit 10 is performed.

Reference numerals 16 and 17 denote first and second AND gates; and 18, a NOT gate. The first and second AND gates 16 and 17 and the NOT gate 18 control the data acknowledge signal b2 from the data buffer unit 10 in accordance with a designation from the host interface controller unit 2 via the data block counter control signal h.

Reference symbol b3 denotes a data acknowledge signal which is the data acknowledge signal b2 applied to the block counter 15 and directly transferred from it without being processed; and g1, an operation end designation signal for informing the end of counting by the block counter 15, as with the signal g0.

Figure 4:
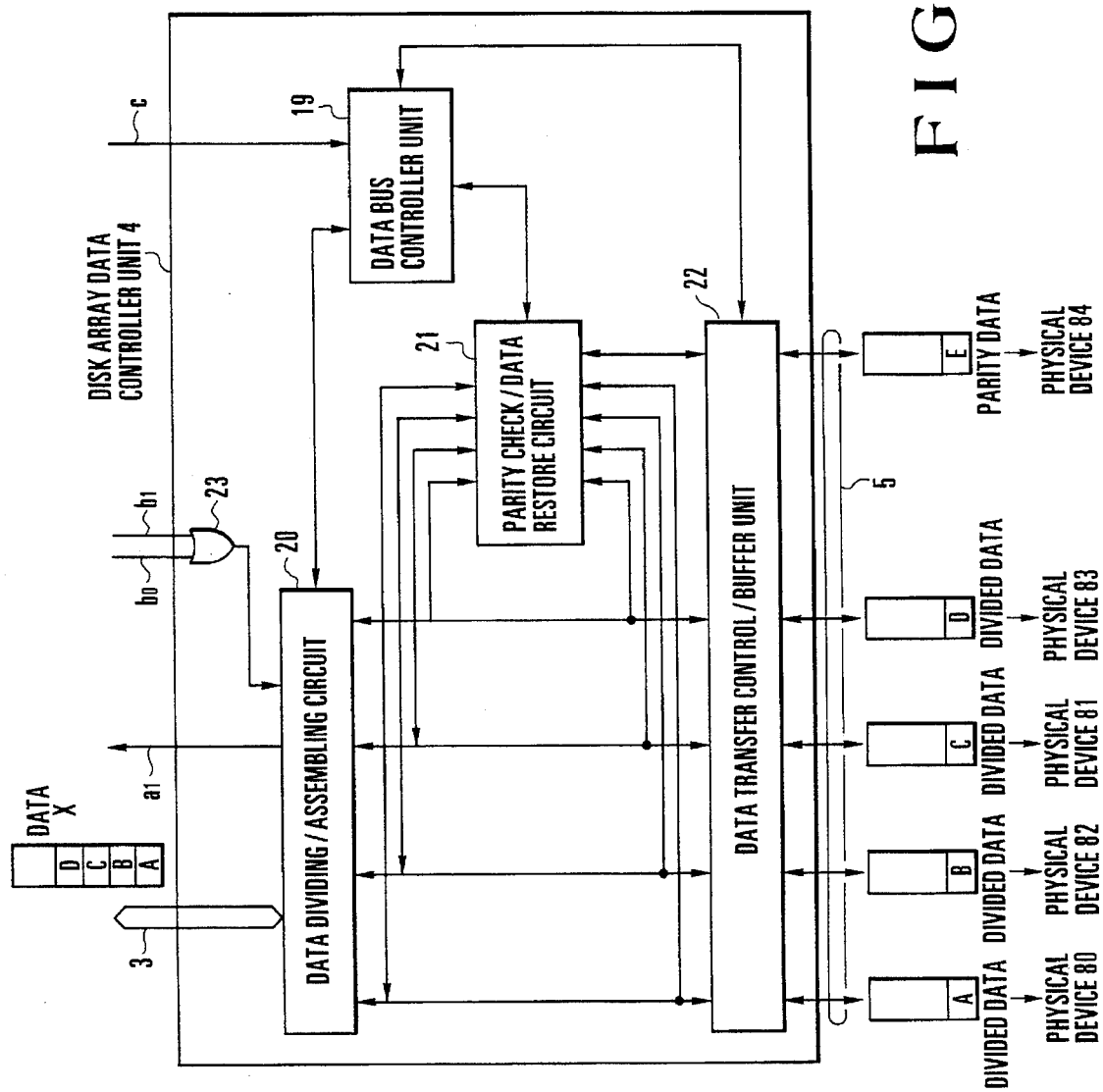
FIG. 4 is a block diagram showing the internal arrangement of a disk array data controller unit of the embodiment in FIG. 1.

FIG. 4 shows the internal arrangement of the disk array data controller unit 4. Reference numeral 19 denotes a data bus controller unit for controlling/managing individual parts of the disk array data controller unit 4 in accordance with designations from the microprocessor 13 of the host interface controller unit 2; 20, a data dividing/assembling circuit for dividing or assembling data in accordance with settings by the data bus controller unit 19; 21, a parity check/data restore circuit for generating a parity for each divided data in data write and performing parity check to restore lost data in data read in accordance with setting by the data bus controller unit 19; 22, a data transfer control/buffer unit for exchanging divided data with the physical devices 8 through the third array data buses 5 and the physical device interface controller units 6; and 23, an OR gate for applying the logical OR of the data acknowledge signals b0 and b1, as the control signals of the first array data bus 3, to the data dividing/assembling circuit 20.

Assume that five physical devices 80 to 84 are provided. In performing data write in this case, input data X from the first array data bus 3 is divided into data A to D by the data dividing/assembling circuit 20. The parity check/data restore circuit 21 generates predetermined parity data E from these divided data A to D. The divided data A to D and the parity data E are stored in the physical devices 80 to 84 via the data transfer control/buffer unit 22. In data read, the data A to E are read out from the physical devices 80 to 84 into the data transfer control/buffer unit 22. The parity check/data restore circuit 21 carries out parity check for these data A to E. Thereafter, the data dividing/assembling circuit 20 assembles the data A to E into the original data X and outputs the data X to the first array data bus 3.

FIG. 5 is a flow chart showing the outline of an operation from occurrence of an unrecoverable read error in the physical device 8 to report processing to the host apparatus, including a designation of reallocation of a replacement sector and a designation of rewrite of repaired data from the microprocessor 13.

The operation of the above arrangement will be described below.

Assume, in FIGS. 1 and 2, that an unrecoverable read error takes place in one of the physical devices 8 when the host apparatus requests the disk array apparatus to perform data read operations and the physical devices 8 start reading data.

Upon being informed of the occurrence of the error by the physical device 8, the physical device interface controller unit 6 reports the occurrence of the error and the error address of a physical sector in which the error has taken place to the microprocessor 13 of the host interface controller unit 2 via the communication memory 9.

In step S1 of FIG. 5, the microprocessor 13 which has received the report sets the buffer pointer of the data buffer unit 10 through the control/monitor path f and designates start of a data write operation. In addition, the microprocessor 13 sets the count value of the data block counter unit 11 through the control/monitor path d and renders the data block counter unit control signal h to the data block counter unit 11 active (enable designation), thereby connecting the data buffer unit 10 to the first array data bus 3 through the second array data bus 3'.

In step S2 of FIG. 5, the microprocessor 13 designates the array data controller unit 4, through the disk control/monitor path c, to repair data to be transmitted to the host apparatus by using the received data from the physical devices 8 except the one that has reported the unrecoverable read error.

The reading action of the disk array data controller unit 4 will be described below with reference to FIGS. 6 and 7.

Figure 6:
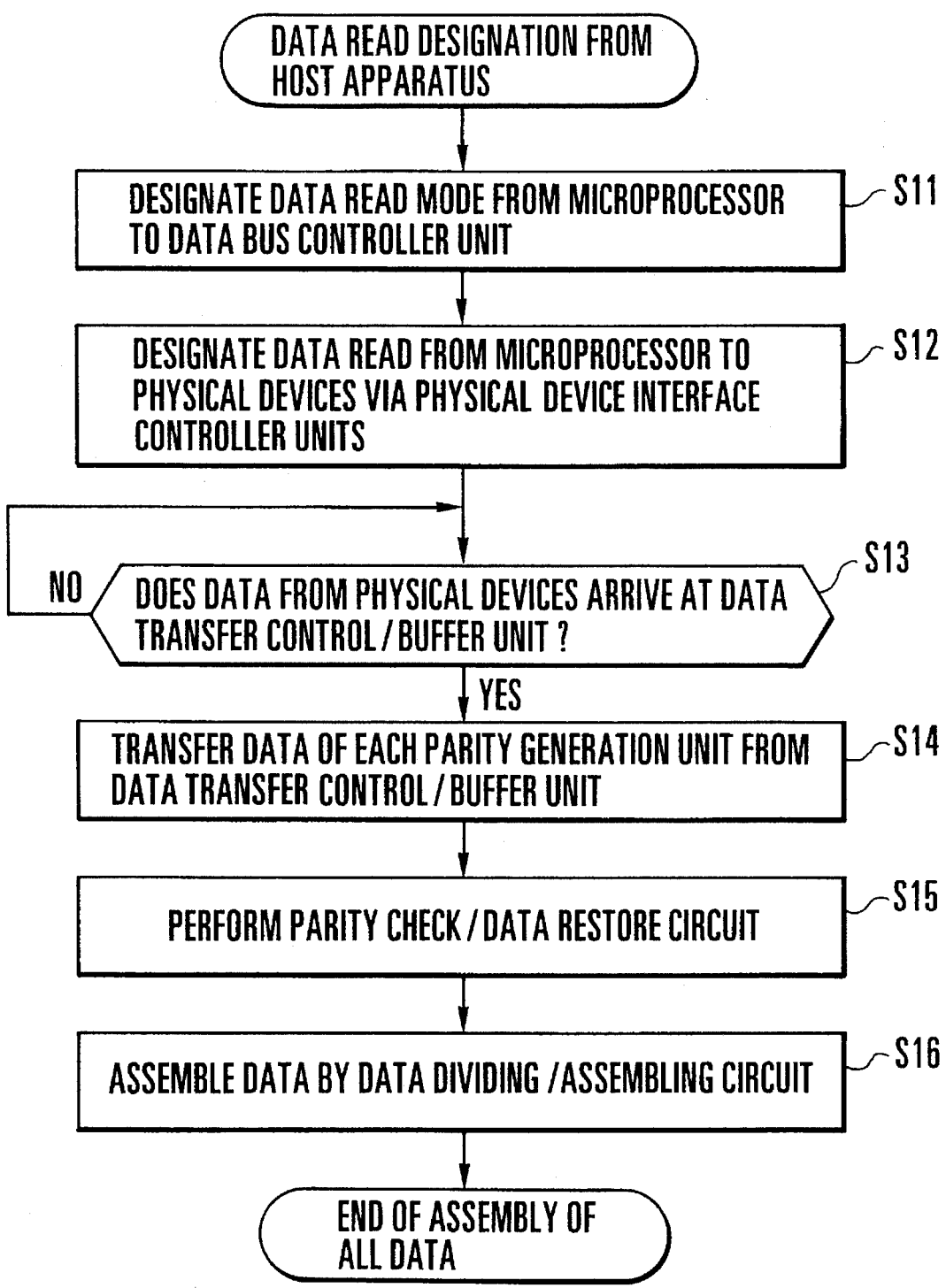
FIG. 6 is a flow chart showing data read processing performed in normal operation by the microprocessor and the disk array data controller unit in accordance with a data read designation from the host apparatus in the embodiment of FIG. 1.

FIG. 6 is a flow chart showing data read processing performed by the microprocessor 13 and the disk array data controller unit 4. When the host apparatus sends a designation of data read, the microprocessor 13 of the host interface controller unit 2 outputs the data read designation to the data bus controller unit 19 of the disk array data controller unit 4 through the disk control/monitor path c in step S11. Upon receiving the designation, the data bus controller unit 19 sets the data dividing/assembling circuit 20 in a data assembly mode, the parity check/data restore circuit 21 in a parity check mode, and the data transfer control/buffer unit 22 in a mode in which the data buses of all of the physical devices are connected to transfer the data in the read direction.

In step S12, the microprocessor 13 designates the physical devices 8 to perform data read operations via the communication paths e, the communication memory 9, and the physical device interface controller units 6.

In step S13, the data transfer control/buffer unit 22 of the disk array data controller unit 4 waits for arrival of divided data read out from the physical devices 8. If all divided data of a predetermined data division unit, e.g., a parity data generation unit arrive, the flow advances to step S14. In step S14, data transfer to the data dividing/assembling circuit 20 and the parity check/data restore circuit 21 is started. In step S15, the parity check/data restore circuit 21 performs parity check for each output divided data from the data transfer control/buffer unit 22. In the case of FIG. 4, for example, this parity check is done by comparing parity data generated from the divided data A to D read out from the physical devices 80 to 83 at the same timing with the parity data E stored in the physical device 84 in the data write. In step S16, the data dividing/assembling circuit 20 assembles the divided data A to D into the data X and outputs the data X to the first array data bus 3. Steps S13 to S16 described above are repeatedly executed to sequentially transfer the data read out from the physical devices 8 to the host apparatus via the host interface controller unit 2.

Figure 7:
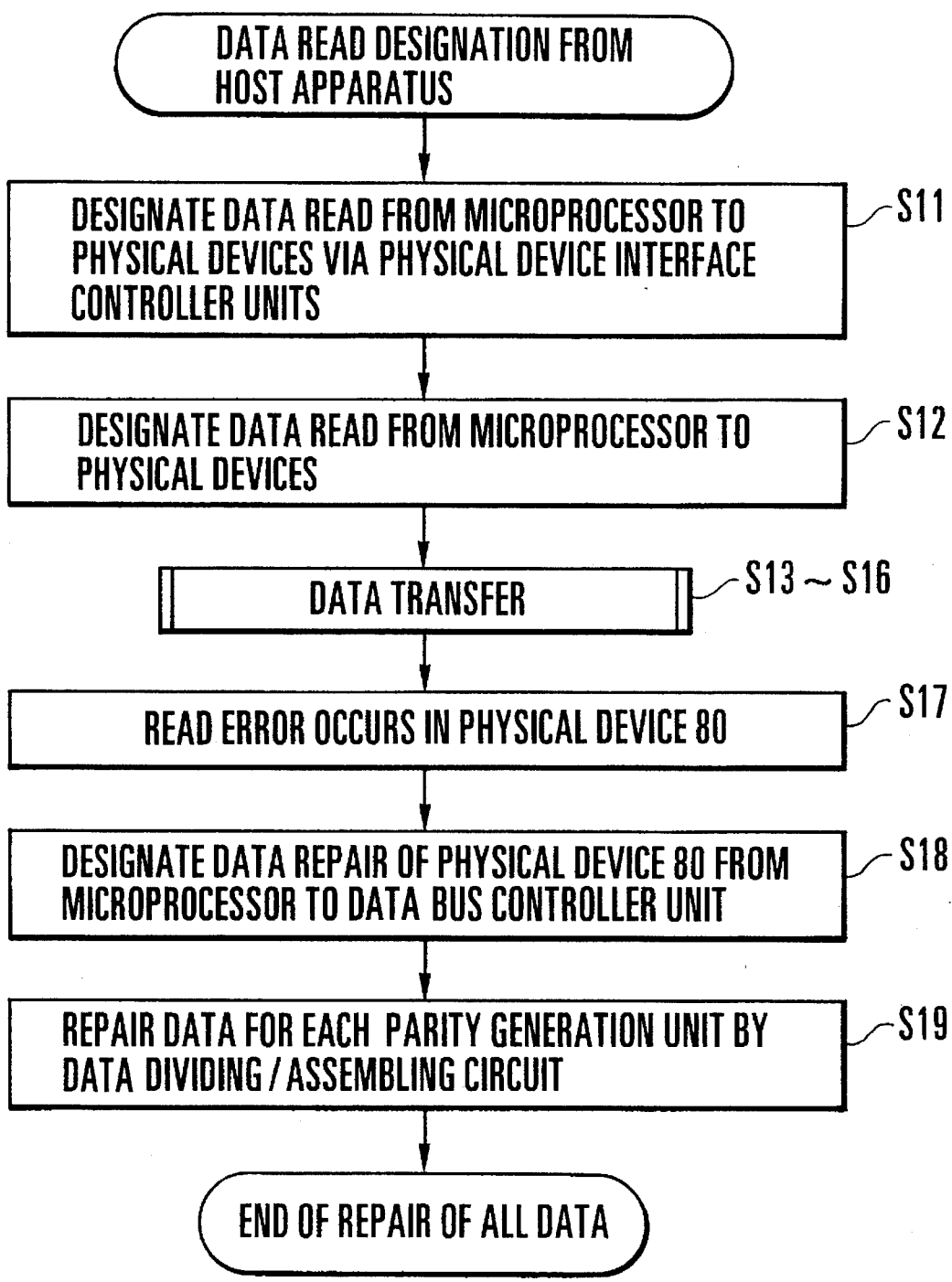
FIG. 7 is a flow chart showing data recovery processing performed when an error has occurred by the microprocessor and the disk array data controller unit in accordance with a data read designation from the host apparatus in the embodiment of FIG. 1.

FIG. 7 is a flow chart showing data recovery processing performed in occurrence of an error by the microprocessor 13 and the disk array data controller unit 4. While steps S13 to S16 are repeatedly executed after the execution of designation setting steps S11 and S12 to sequentially transfer the readout data from the physical devices 8 to the host apparatus via the host interface controller unit 2, if a read error occurs in any of the physical devices, e.g., in the physical device 80 in FIG. 4, in step S17, the microprocessor 13 is informed of the occurrence of the error via the corresponding physical device interface controller unit 6, the communication path e, and the communication memory 9. In step S18, the microprocessor 13 outputs a designation of data repair of that physical device 80 to the data bus controller unit 19 through the disk control/monitor path e.

Upon receiving the designation, the data bus controller unit 19 sets the data dividing/assembling circuit 20 in the data assembly mode, the parity check/data restore circuit 21 in a mode of restoring the data of the physical device 80, and the data transfer control/buffer unit 22 in a mode of disconnecting the data bus of the physical device 80. In step S19, the divided data A stored in the physical device 80 is restored on the basis of the divided data B to D and the parity data E from the physical devices 81 to 84 other than the physical device 80. The data dividing/assembling circuit 20 assembles the original data X and outputs the data X to the first array data bus 3. Steps S13 to S16 discussed above are repeatedly executed to sequentially transfer the data read out from the physical devices 8 to the host apparatus via the host interface controller unit 2.

The parity check/data restore circuit 21 performs parity generation, parity check, and data restoration as follows.

First, in a normal state in which all the physical devices operate normally, parity data generation is carried out in accordance with a write designation. For example, assuming an exclusive-OR operator is represented by $\oplus$ on the basis of an odd parity, the following relationship is established between the divided data A to D and the parity data E.

$$(A \oplus B \oplus C \oplus D) \oplus E = 1 \quad (1)$$

Therefore, the parity data E is generated by:

$$E = \overline{(A \oplus B \oplus C \oplus D)} \quad (2)$$

Parity check is performed in accordance with a read designation by checking whether Equation (1) above is established for each of the divided data A to E read out from the physical devices.

On the other hand, in a degenerated state in which one of the physical devices, e.g., the physical device 80 is inoperable, the parity data E is generated by the parity data generation processing based on Equation (2) above in accordance with a write designation. In addition, in accordance with a read designation, the divided data A which satisfies Equation (1) is restored from the divided data B to D that are normally read out and the parity data E. That is, the restoration of the divided data A is carried out by:

$$A = \overline{(B \oplus C \oplus D \oplus E)} \quad (3)$$

After one physical device is replaced with a normal one (data is indefinite) or in a repair state in which partial data is indefinite due to, e.g., sector reallocation to one physical device, the parity data E is generated by the parity data generation processing based on Equation (2) in accordance with a write designation. Also, the restoration of the divided data based on Equation (3) is performed in accordance with a read designation.

As a consequence, the repaired data is formed by the disk array controller unit 4 and transferred as read data to the host apparatus via the host interface 1 as the host interface controller 12 continues the data transfer processing.

In parallel with this data transfer processing, in step S3 of FIG. 5, the microprocessor 13 designates reallocation of a replacement sector for the physical device 8 which has reported the error.

The reallocation of a replacement sector for an error address performed in step S3 of FIG. 5 will be described below with reference to FIG. 8.

FIG. 8 is a flow chart showing the replacement sector reallocation processing.

In step S21, the microprocessor 13 in the host interface controller unit 2 designates, via the communication path e and the communication memory 9, a given one of the physical device interface controller units 6 to perform reallocation for an error address (replacement sector) acquired by the report of the occurrence of the read error. In step S22, the physical device interface controller unit 6 that has received the designation designates reallocation for the error address of the corresponding physical device 8 via the physical device interface 7.

Accordingly, in step S23, the physical device 8 that has received the designation executes reallocation processing inherent in each individual physical device. In step S24, the result of the reallocation is reported to the physical device interface controller unit 6 via the physical device interface 7. In step S25, this physical device interface controller unit 6 reports the execution result of the replacement sector reallocation to the microprocessor 13 in the host interface controller unit 2 via the communication path e and the communication memory 9.

In step S4 of FIG. 5, data read operations to the other physical devices 8 and data repair are ended at the time the transfer of the repaired data to the host apparatus is ended.

The operation of the data block counter unit 11 will be described below with reference to FIG. 3.

First, when the microprocessor 13 initializes the block counter 15 by setting the count value in the block counter 15 through the control/monitor path d, the operation end designation signals g0 and g1 are rendered inactive. When the data block counter unit control signal h is rendered active, the output from the AND gate 17 is made active, and the data acknowledge signal b3 is output as the data acknowledge signal b1 through the AND gate 16.

Consequently, the data acknowledge signal b1 is input to the disk array data controller unit 4 to allow data write from the disk array data controller unit 4 to the data buffer unit 10 or data read from the data buffer unit 10 to the disk array data controller unit 4.

When the block counter 15 finishes counting upon execution of the data write or read to the data buffer unit 10, both the operation end designation signals g0 and g1 are rendered active. As a result, the output from the NOT gate 19 is rendered inactive, and so the data block counter unit control signal h is disconnected by the AND gate 17.

Referring back to FIGS. 1 and 2, upon detecting the end of the set count, the counter 15 sends the operation end designation signal g0 to report the end of counting to the data buffer unit 10. The data buffer unit 10 is informed of a report of this end of counting as an operation end designation and therefore ends the write or read operation to the buffer.

When the transfer of the repaired data to the host apparatus is ended, the microprocessor 13 checks in step S5 of FIG. 5 whether the replacement is done normally. If an abnormality is found (NO), the microprocessor 13 reports the abnormality to the host apparatus.

If the replacement is done normally (YES), the microprocessor 13 performs in step S6 of FIG. 5 data path setting for the disk array data controller unit 4 through the control/monitor path c in order to write the repaired data only in the physical device 8 in which the unrecoverable read error has occurred. The microprocessor 13 also performs setting of a buffer pointer for a data read and a read start designation (enable setting) with respect to the data buffer unit 10 through the control/monitor path f.

Note that the data write/read processing for the data buffer unit 10 is done by a DMA (Direct Memory Access) controller of the microprocessor 13. This reduces the processing load on the microprocessor 13. Note also that the buffer pointer is designated in the same manner as for address information which the microprocessor 13 sets for the DMA controller. The data transfer direction is also set in the same fashion as that designated for the DMA controller.

The microprocessor 13 then sets the count value of the data block counter unit 11 through the control/monitor path d. In addition, the microprocessor 13 renders the data block counter unit control signal h to the data block counter unit 11 active, thereby connecting the data buffer unit 10 to the first array data bus 3 through the second array data bus 3'.

Thereafter, to write the repaired data in the error address of the physical device 8 to which the replacement sector has already been reallocated, the microprocessor 13 sends this designation to the corresponding physical interface controller unit 6 via the communication memory 9 in step S7 of FIG. 5.

More specifically, the microprocessor 13 outputs, to the data bus controller unit 19 (FIG. 4), a designation of transfer of the data only to the physical device in which the repaired data is to be written, through the control/monitor path c. Upon receiving the designation, the data bus controller unit 19 sets the data dividing/assembling circuit 20 in a data division mode, the parity check/data restore circuit 21 in a parity data generation mode, and the data transfer control/buffer unit 22 in a mode in which the data is transferred only to the physical device designated by the microprocessor 13.

When the write of the repaired data is ended, the physical device interface controller unit 6 reports the result to the host interface controller unit 2 via the communication memory 9. Thereafter, the host interface controller unit 2 reports the end of the processing to the host apparatus, thereby ending the processing.

In the disk array apparatus with the above arrangement, therefore, data repair is performed for an unrecoverable read error of a physical device, which has occurred during data read, by using the data (including the parity data) of other physical devices. This makes transfer of the repaired data to the host apparatus possible. In addition, the disk array apparatus itself can perform reallocation of a replacement sector to the error address and can write the repaired data in the replacement sector that has been reallocated to the physical device with the error. This achieves high reliability and high performance of the apparatus.

Note that, in the above embodiment, it is assumed that an unrecoverable read error takes place in one data read operation. However, it is also possible to handle a plurality of read errors by sequentially allocating the buffer pointers of the data buffer unit 10. That is, the present invention can be carried out in the form of various modifications without departing from the spirit and scope of the invention.

According to the present invention, as has been discussed above, it is possible to provide a disk array apparatus capable of repairing the data of a physical device in which an unrecoverable read error has occurred during data read and transferring the repaired data to a host apparatus, and also capable of rewriting the repaired data in a replacement sector for the error address, thereby realizing high reliability and high performance.

What is claimed is:

1. A disk array apparatus comprising:

a host interface connected to a host apparatus;

a host interface controller unit, connected to said host interface, for controlling data input/output of said host interface by using a microprocessor;

a first array data bus connected to said host interface controller unit;

a disk array data controller unit, connected to said first array data bus, for performing input data edit processing in accordance with a designation from said microprocessor;

a plurality of physical devices for storing dam, at least one of said physical devices being used to store parity data, and each of said physical devices for reporting occurrence of an error if an unrecoverable read error occurs;

a plurality of physical device interfaces connected to said physical devices;

a plurality of physical device interface controller units for controlling data transmission/reception with respect to said physical devices via said physical device interfaces, each of said physical device interface controller units for reporting a content of occurrence of an error to said microprocessor upon receiving a report of occurrence of an error from said physical device;

a plurality of third array data buses for performing data communication between said disk array data controller unit and said physical device interface controller units;

a data buffer unit, connected to said first array data bus through second array data buses, for storing repaired data for an unrecoverable read error occurring in one of said physical devices; and a data block counter unit for counting data in performing data write/read to said data buffer unit, and for reporting the end of the data write/read, wherein said microprocessor comprises:

repairing means for causing, upon receiving the report of the content of occurrence of an error from said physical device interface controller unit, said array data controller unit to repair read data by using received data from said physical devices except for the one which has reported the unrecoverable read error;

transfer means for transferring the repaired data obtained by said repairing means to said host apparatus as read data;

writing means for writing the repaired data in said data buffer unit;

write end determining means for determining the end of the write of the repaired data from the count value of said data block counter unit;

reallocating means for reallocating a replacement sector to said physical device which has reported the error; and means for reading out the repaired data written in said data buffer unit and storing the readout data in the replacement sector allocated by said reallocating means, after said write end determining means determines the end of the write.

2. An apparatus according to claim 1, wherein said microprocessor further comprises means for sequentially allocating buffer pointers of said data buffer unit if a plurality of read errors occur.

3. An apparatus according to claim 1, wherein said writing means writes the repaired data in said data buffer unit simultaneously with said transfer means transferring the repaired data to said host apparatus.

4. An apparatus according to claim 2, wherein said writing means writes the repaired data in said data buffer unit simultaneously with said transfer means transferring the repaired data to said host apparatus.

5. A disk array apparatus comprising:

a host interface connected to a host apparatus;

a host interface controller unit, connected to said host interface, for controlling data input/output of said host interface by using a microprocessor;

an array data bus connected to said host interface controller unit;

a disk array data controller unit, connected to said array data bus, for performing input data edit processing in accordance with a designation from said microprocessor;

a plurality of physical devices for storing data, at least one of said physical devices being used to store parity data, and each of said physical devices for reporting occurrence of an error if an unrecoverable error occurs;

a plurality of physical device interfaces connected to said physical devices;

a plurality of physical device interface controller units for controlling data transmission/reception with respect to said physical devices, each of said physical device interface controller units for reporting a content of occurrence of an error to said microprocessor upon receiving a report of occurrence of an error from said physical device;

a data buffer unit, operatively coupled to said array data bus, for storing repaired data for an unrecoverable read error occurring in one of said physical devices; and a data block counter unit for counting data in performing data write/read to said data buffer unit, and reporting the end of the data write/read, wherein said microprocessor comprises:
- repairing means for causing, upon receiving the report of the content of occurrence of an error from said physical device interface controller unit, said array data controller unit to repair read data by using received data from said physical devices except for the one which has reported the unrecoverable read error;
- transfer means for transferring the repaired data obtained by said repairing means to said host apparatus as read data;
- writing means for writing the repaired data in said data buffer unit simultaneously with said transfer means transferring the repair data;
- write end determining means for determining the end of the write of the repaired data from the count value of said data block counter unit;
- reallocating means for reallocating a replacement sector to said physical device which has reported the error; and
- means for reading out the repaired data written in said data buffer unit and storing the readout data in the replacement sector allocated by said reallocating means, after said write end determining means determines the end of the write, wherein said writing means writes the repaired data in said data buffer unit simultaneously with said transfer means transferring the repaired data to said host apparatus, without imposing any additional load on said host apparatus.

6. An apparatus according to claim 5, wherein said microprocessor further comprises means for sequentially allocating buffer pointers of said data buffer unit if a plurality of read errors occur.

7. An apparatus according to claim 5, wherein said repaired data is formed by said disk array data controller unit and transferred as read data to said host apparatus via said host interface as said host interface controller continues data input/output of said host interface.

* * * * *